United States Patent [19]

Drekmeier et al.

[11] Patent Number: 5,788,544
[45] Date of Patent: Aug. 4, 1998

[54] MULTI-POLE VARIABLE SMD TERMINAL ARRANGEMENT AND METHOD FOR ITS MOUNTING ON A CIRCUIT SUBSTRATE

[75] Inventors: Karl-Gerd Drekmeier, Unterhaching; Gerhard Winter, Munich, both of Germany

[73] Assignee: Siemens Aktiengesellschaft, Munich, Germany

[21] Appl. No.: 709,282

[22] Filed: Sep. 6, 1996

[30] Foreign Application Priority Data

Sep. 8, 1995 [DE] Germany ............... 195 33 299.7

[51] Int. Cl.$^6$ ..................................................... H01R 9/24
[52] U.S. Cl. ................... 439/885; 439/83; 29/842; 29/843
[58] Field of Search ................. 439/83, 885; 29/832, 29/842, 843, 830, 884

[56] References Cited

U.S. PATENT DOCUMENTS

| 4,294,007 | 10/1981 | Ellis | 29/830 |
| 4,978,307 | 12/1990 | Billman et al. | 439/83 |
| 4,979,903 | 12/1990 | Gosselin | 439/885 |
| 5,307,929 | 5/1994 | Seidler | 29/884 |
| 5,490,788 | 2/1996 | Mazzochette | 439/83 |

Primary Examiner—P. Austin Bradley
Assistant Examiner—T. C. Patel
Attorney, Agent, or Firm—Hilt & Simpson

[57] ABSTRACT

A multi-pole, variable SMD terminal arrangement mountable on a circuit substrate has a stamped metallic element with at least three terminal poles connected with one another by means of a common connecting strip that can be removed after the soldering, the terminal poles having variably formed contact areas on the substrate side that are respectively deflected on one side from the plane of the connecting strip in basically z-shaped fashion, so that the contact areas deflected towards opposite sides form a support base for the terminal arrangement during assembly and soldering. The contact areas comprise end areas that form a contact plane that is coplanar to the substrate during assembly and soldering.

10 Claims, 2 Drawing Sheets

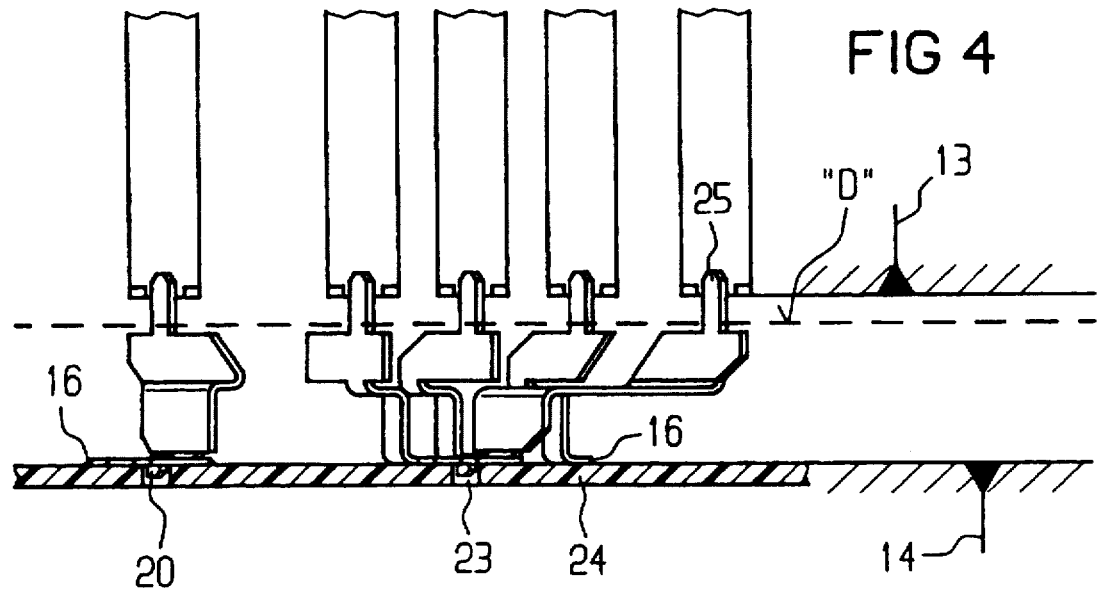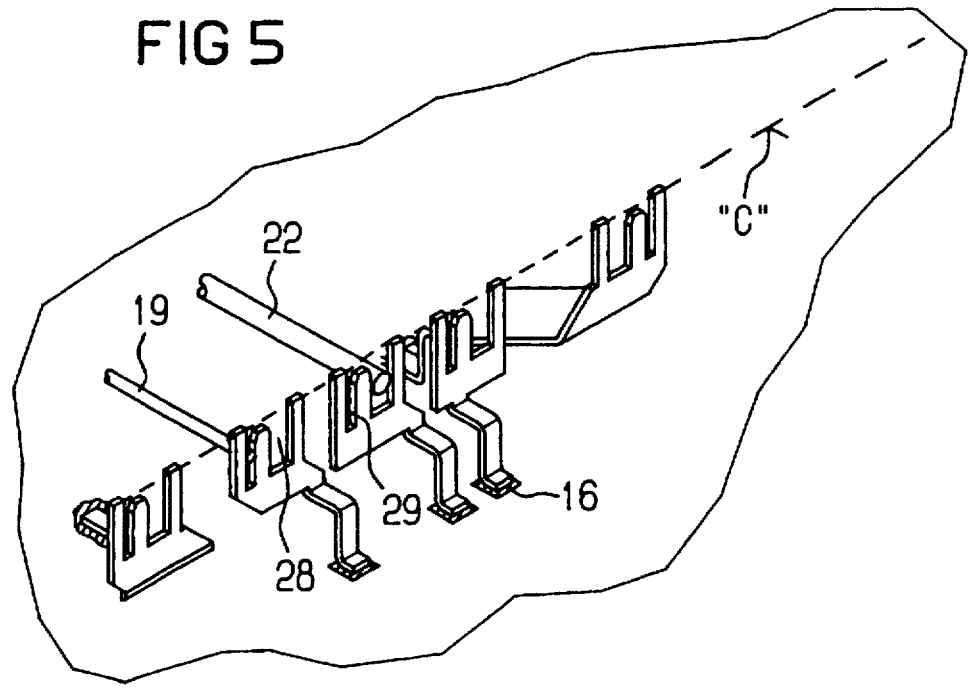

MULTI-POLE VARIABLE SMD TERMINAL ARRANGEMENT AND METHOD FOR ITS MOUNTING ON A CIRCUIT SUBSTRATE

BACKGROUND OF THE INVENTION

The invention concerns a multi-pole terminal arrangement that can be fixed on a circuit substrate by means of SMD soldering, and a method for this purpose.

In e.g. power modules in which hybrid circuits are attached to a cooling body and are covered with a protective housing through which outer terminals of the module are led out, an efficient terminal technique is required for the connection of the terminal points on the circuit substrate with the outer terminals located perpendicularly thereover in the interior of the protective covering. Previously, this has taken place via the soldering of individual head wires or L-shaped individual terminals onto the circuit substrate. In each case, a particular graphite mold is required for this purpose in order to hold these terminals in position and subsequently to solder them. Since the mold must subsequently be removed, this assembly technique is very expensive.

SUMMARY OF THE INVENTION

An object of the invention is to develop a terminal technique that is loadable with high current and is mechanically flexible in the direction of the three spatial axes, and which is also SMD-capable. All terminal poles of the terminal arrangement should thus be collectively solderable for installation at the surfaces.

This object is achieved by means of a terminal arrangement of the type named above, and comprises:
- a stamped metallic bent element having at least three terminal poles connected with one another by means of a common connecting strip that is removable after the soldering;
- the terminal poles being variably formed contact areas on the substrate side that are deflected from the plane of the connecting strip in essentially z-shaped fashion, i.e. respectively towards one side;
- the contact areas, deflected towards opposite sides, forming a support base for the terminal arrangement during installation and soldering; and
- the contact areas comprise end areas that form a contact plane that is coplanar to the substrate during equipping and soldering.

Furthermore, according to the invention the terminal arrangement is mounted on a circuit substrate so that the contact areas of the terminal arrangement are deflected in the shape of a z, so that subsequently the terminal arrangement is placed and pressed upon the substrate in such a way that a coplanarity of all terminal poles of about 50 μm arises, so that the end areas of the terminal poles are collectively soldered with the circuit substrate, and so that finally the connecting strips are separated from the terminal poles.

In the following, the invention is explained in more detail on the basis of exemplary embodiments represented in the drawing.

FIG. 4 is a side view of a terminal arrangement in the assembled state on a circuit substrate; and FIG. 5 is a perspective view of a further exemplary form of an assembled terminal arrangement.

DESCRIPTION OF THE PREFERRED EMBODIMENTS

Figure 1:
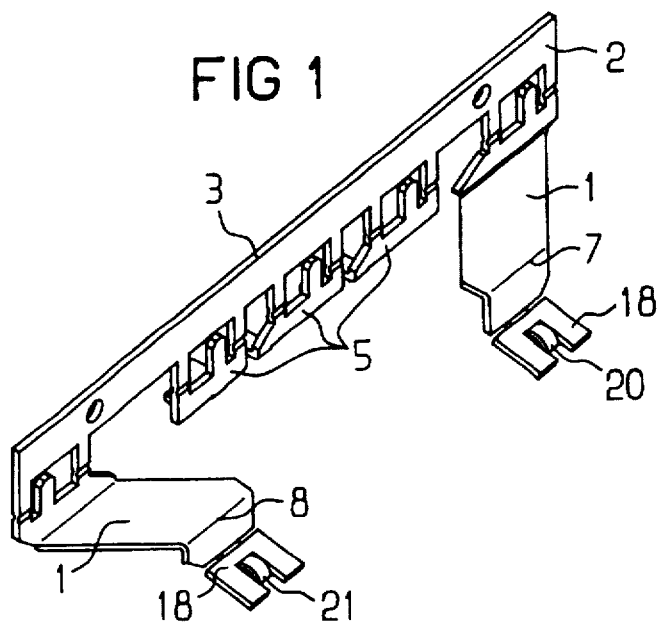
FIGS. 1 to 3 illustrate in respectively different perspective, three different exemplary forms of terminal arrangements constructed according to the invention and arranged in a connecting strip.
Figure 2:
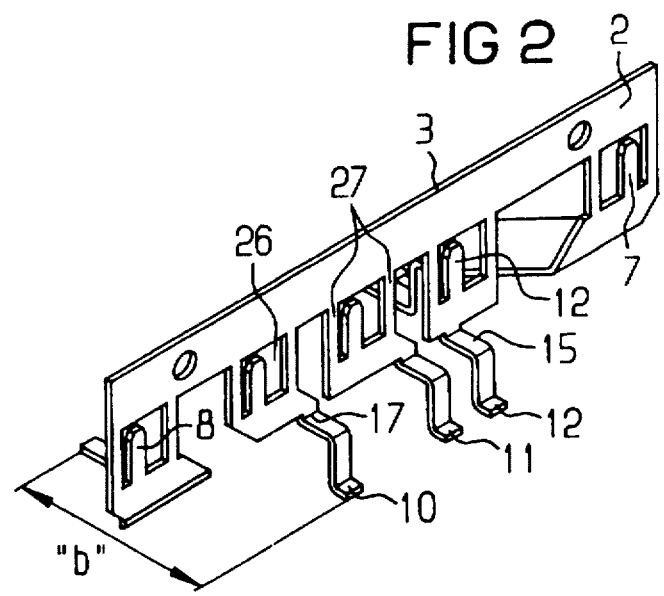
Figure 3:
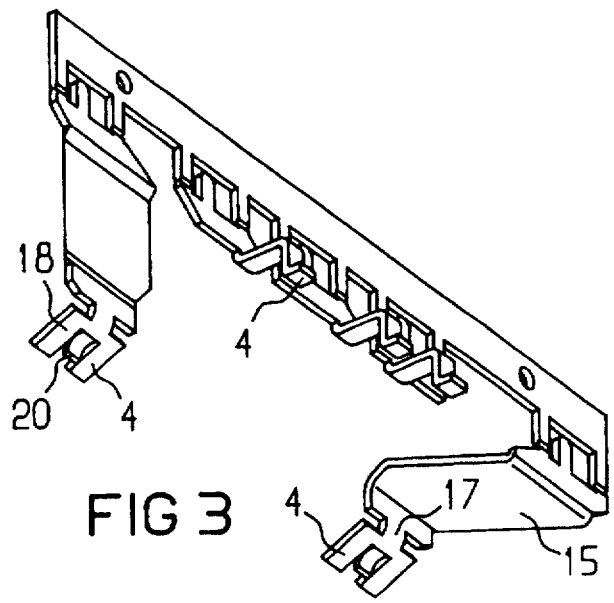

The terminal arrangement shown in the drawing is comprised of a connecting strip 3 manufactured from a stamped metal bent element, on which, as shown in FIGS. 1 to 3, several contact areas are arranged or shaped. The contact areas are generally variously formed. FIG. 1 clearly shows two outlying contact areas 1, deflected in the shape of a Z from the substantially vertical plane 2 of the connecting strip 3 on one side, here basically towards the viewer of the figure, so that the necessary coplanarity of all terminals of approximately. 50 μm arises in the contact plane 4, shown in FIG. 3, for the SMD mounting plane, or this coplanarity can be produced by means of slight alteration of the deflection, e.g. by pressure on the substrate.

Furthermore, in FIG. 1 three contact areas 5 are visible, which are again deflected in the shape of a Z on one side, here, however, in the opposite direction. These terminal poles are also bent so that they achieve a coplanarity of approximately 50 μm to the contact plane 4. This shaping, with respectively at least one terminal pole as a support leg at each side, creates a stable support base "b," which is required in order to prevent tipping, e.g. during equipping, transport or reflow soldering.

The shapes and dimensions of the deflections, as well as the number of terminal poles 7, can be variably adapted to the layout, hybridization and contact requirements. It is particularly advantageous that, alongside the position requirements, the electrical and mechanical requirements can be designed specifically for individual contacts. For example, the poles 7 and 8 can be constructed as motor terminals that conduct high current ($\geq 30$ A) and are relatively broader than the poles 10, 11 and 12, which are relatively narrower in the contact area, and which can be provided for example for control or sensor terminals.

As indicated in FIG. 4, the mechanical loads arise through two different tension planes 13 and 14, since these can move vertically and horizontally to one another. These movements are compensated by the correspondingly dimensioned deflections 15 (see, for example, illustrations 2 and 3) in such a way that the forces at the soldering points 16 lie far below the critical boundary values. The cross-sectional taperings 17 shown in FIGS. 2 and 3 are arranged so that a soldering-oriented heat braking and/or an intended bend point for the prevention of mechanical shell stresses arises, which particularly prevent the SMD soldering points from being pulled off. The SMD shaping of the end areas of the contact areas is generally shown in the figures as a flat contact tongue, but can also be differently constructed. The SMD shaping 18 of the two outlying contact areas can be provided with an auxiliary adjustment means, formed of the prong 20, bent 90° out from the contact plane. The U contour that arises due to the prong construction has a positive effect on the solder flow of the solder points 16. Solder points 16 arise that are largely free of cavities and are therefore durable. The auxiliary adjustment means is inserted into holes 23 of the SMD circuit support or substrate 24, and thus correctly positions the SMD contacts to the layout pads. If the prongs are omitted, a stable positioning is achieved by means of an adhesive soldering paste on the terminal pads of the circuit.

The soldering pins 25 of the contacts are located on the opposite side of the SMD terminals. Two holding webs 27 are respectively formed by the frame-shaped free punch (see, for example, FIG. 2), which provide a stable decoupling to the connecting strip 3. This stability, having an allowable bend force of fully 3 N in the region of elastic deformation, guarantees the necessary coplanarity of approximately 50 μm.

After the collective soldering of the contacts, the connecting strip 3 is separated, see, for example, FIGS. 4 and 5. Soldering forks 28 and 29, for different connection wire cross-sections 19 and 22, or individual soldering pins 25, can be produced by the position of the separation plane "plane C" or "plane D."

The inventive terminal construction of the invention is suitable for large-scale manufacture. It can be realized in a progressive die, e.g. from a tinned semi-finished strip, and can be installed fully automatically in automatable packing machines that are suited for standard pick-and-place machines.

Although various minor changes and modifications might be proposed by those skilled in the art, it will be understood that our wish is to include within the claims of the patent warranted hereon all such changes and modifications as reasonably come within our contribution to the art.

We claim as our invention:

1. A multi-pole terminal arrangement for attachment to a circuit substrate by SMD soldering, comprising:

a stamped metallic bent element having at least three terminal poles connected with one another by a common connecting strip that is designed to be removable after the soldering;

said terminal poles comprising variably formed contact areas extending from a downwardly facing side edge of the connecting strip facing the substrate, the contact areas being deflected laterally away from a substantially vertical plane of the connecting strip in substantially z-shaped fashion;

the contact areas being deflected towards opposite sides of the connecting strip so that they form a self-support base for the terminal arrangement during assembly and soldering prior to removal of the connecting strip; and the contact areas comprising end areas that define a contact plane that is coplanar to the substrate during assembly and soldering.

2. The terminal arrangement according to claim 1 wherein the end areas are respectively formed by a SMD shaping connected to the respective z-shaped areas.

3. The terminal arrangement according to claim 2 wherein the SMD shapings of two outlying terminal poles comprise an adjustment prong bent out from the contact plane in a direction of the substrate.

4. The terminal arrangement according to claim 1 wherein at least one terminal pole for high current has a relatively broadly constructed contact area, and at least one control or sensor terminal pole has a relatively narrowly constructed contact area.

5. The terminal arrangement according to claim 1 wherein the terminal poles are designed as soldering pins at their ends turned away from the substrate.

6. The terminal arrangement according to claim 1 wherein the terminal poles are designed as soldering forks at their ends turned away from the substrate.

7. A multi-pole terminal arrangement for attachment to a circuit substrate by SMD soldering, comprising:

a metallic bent element having at least three terminal poles connected with one another by a common connecting strip that is designed to be removable after the soldering;

said terminal poles comprising formed contact areas on a side facing the substrate that are deflected away from a substantially vertical plane of the connecting strip in substantially z-shaped fashion;

some of the contact areas being deflected towards one side and another of the contact areas being deflected towards an opposite side of the vertical plane so that they form a support base for the terminal arrangement during assembly and soldering; and the contact areas comprising end areas that form a contact plane that is substantially coplanar to the substrate during assembly and soldering.

8. A method for mounting a terminal arrangement on a circuit substrate, comprising the steps of:

deflecting contact areas of the terminal arrangement in a shape of a z so that the contact areas extend from a planar connecting strip of the terminal arrangement to opposite sides of the plane of the connecting strip;

placing the terminal arrangement on and pressing it against the substrate in such a way that a coplanarity of all terminal poles of about 50 μm arises at the substrate and such that the connecting strip lies in a substantially vertical plane;

collectively soldering end areas of the terminal poles with the circuit substrate; and separating the connecting strip from the terminal poles.

9. The method according to claim 8 wherein the soldering pins or soldering forks are produced through a choice of a position of a plane of separation.

10. A method for mounting a terminal arrangement on a circuit substrate, comprising the steps of:

deflecting contact areas extending from one edge of a planar connecting strip of the terminal arrangement in a shape of a z and such that the contact areas extend in opposite directions laterally of a plane of the connecting strip;

placing the terminal arrangement on and pressing it against the substrate to achieve substantial coplanarity of all terminal poles and such that the plane of the connecting strip is substantially vertical;

soldering end areas of the terminal poles with the circuit substrate; and separating the connecting strip from the terminal poles.

* * * * *